US011517933B2

(12) United States Patent
LaForce

(10) Patent No.: US 11,517,933 B2
(45) Date of Patent: Dec. 6, 2022

(54) SLOTTED DISK FIXTURE

(71) Applicant: Oerlikon Surface Solutions AG, Pfäffikon, Pfäffikon (CH)

(72) Inventor: Phillip J. LaForce, Taylor, MI (US)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 0 days.

(21) Appl. No.: 17/007,527

(22) Filed: Aug. 31, 2020

(65) Prior Publication Data

US 2021/0060601 A1 Mar. 4, 2021

Related U.S. Application Data

(60) Provisional application No. 62/893,269, filed on Aug. 29, 2019, provisional application No. 62/893,275, filed on Aug. 29, 2019.

(51) Int. Cl.
*B05C 5/02* (2006.01)
*B05C 13/02* (2006.01)
*B05D 1/00* (2006.01)

(52) U.S. Cl.
CPC .............. *B05C 5/022* (2013.01); *B05C 13/02* (2013.01); *B05D 1/002* (2013.01)

(58) Field of Classification Search
None
See application file for complete search history.

(56) References Cited

U.S. PATENT DOCUMENTS

| 5,997,947 | A | * | 12/1999 | Burns | C23C 14/505 427/240 |
| 7,837,843 | B2 | * | 11/2010 | Sharp | C23C 14/505 204/298.15 |
| 2007/0007405 | A1 | * | 1/2007 | Al-Mayah | E04C 5/085 248/200 |
| 2013/0177707 | A1 | * | 7/2013 | Feuerstein | C23C 14/505 427/282 |

* cited by examiner

Primary Examiner — Jethro M. Pence
(74) Attorney, Agent, or Firm — Pearne & Gordon LLP

(57) ABSTRACT

A coating assembly for coating a plurality of substrates. The coating assembly includes a chamber. At least one target is disposed in the chamber and includes a coating material. At least one power supply is connected to the target. At least one support fixture is disposed in the chamber. The at least one support fixture includes a base having a plurality of recesses formed in an upper surface of the base. A first mounting component has a plurality of slots. The first mounting component is positioned on the upper surface of the base wherein at least some of the plurality of recesses are in registry with corresponding ones of the plurality of slots to define a plurality of cavities, each of the plurality of cavities configured to hold at least one of the plurality of substrates to be coated.

11 Claims, 5 Drawing Sheets

SLOTTED DISK FIXTURE

CROSS-REFERENCE TO RELATED APPLICATIONS

Benefit of U.S. Provisional Patent Application Ser. No. 62/893,269 (filed Aug. 29, 2019) and 62/893,275 (filed Aug. 29, 2019) is hereby claimed, the disclosures of which are hereby incorporated herein by reference.

FIELD OF THE INVENTION

This application relates generally to an apparatus for coating substrates in a coating chamber, in particular, a fixture for supporting substrates in the coating chamber.

BACKGROUND OF THE INVENTION

Conventionally fixtures have been used for holding substrates that are to be coated. These fixtures include features for grasping the substrates. However, for small substrates, such as saw blade teeth, it is difficult to hold the substrate and still coat the surfaces of the substrate. One conventional method is to place the teeth on a surface and coat the teeth using a typical coating process. However, this tends to result in a small surface area for brazing/soldering during a subsequent processing step. Another conventional method is to braze/solder the teeth to a steel, circular saw blade disk and then coat the entire assembly. However, coating the assembly often warps the assembly thereby causing the assembly to be unbalanced and unusable.

The present invention provides an apparatus for improving the positioning of substrates, e.g. saw blade teeth in a coating chamber.

BRIEF SUMMARY OF THE INVENTION

In accordance with one aspect, there is provided a coating assembly for coating a plurality of substrates. The coating assembly includes a chamber. At least one target is disposed in the chamber and includes a coating material. At least one power supply is connected to the target. At least one support fixture is disposed in the chamber. The at least one support fixture includes a base having a plurality of recesses formed in an upper surface of the base. A first mounting component has a plurality of slots. The first mounting component is positioned on the upper surface of the base wherein at least some of the plurality of recesses are in registry with corresponding ones of the plurality of slots to define a plurality of cavities, each of the plurality of cavities configured to hold at least one of the plurality of substrates to be coated.

In the coating assembly the base and the first mounting component are configured such that the plurality of substrates extends a predetermined distance above an upper surface of the first mounting component.

The coating assembly further including a second mounting component. The second mounting component positioned on the upper surface of the base and having an edge abutting the first mounting component to close an open end of at least one of the plurality of slots.

In the coating assembly at least one of the base, the first mounting component and the second mounting component is made from low-carbon steel.

In the coating assembly each of the base, the first mounting component and the second mounting component is made from low-carbon steel.

In coating assembly at least one of the base, the first mounting component and the second mounting component is made from 12L14 low-carbon steel.

In the coating assembly each of the base, the first mounting component and the second mounting component is made from 12L14 low-carbon steel.

In the coating assembly the base is circular and the plurality of recesses extend radially about an outer periphery of the base.

In the coating assembly the first mounting component is a ring and the open ends of the plurality of slots are in registry with an inner opening of the first mounting component.

In the coating assembly the at least one support fixture is attached to a rotatable shaft or a plurality of rotatable shafts is disposed in the chamber and each of the plurality of rotatable shafts includes at least one support fixture.

The coating assembly further including a shaft attached to a central opening of the at least one support fixture and a motor attached to the shaft for rotating the shaft and the at least one support fixture within the chamber about a longitudinal axis of the shaft or a plurality of rotatable shafts disposed in the chamber and each of the plurality of rotatable shafts including at least one support fixture that is rotatable about a longitudinal axis of a respective rotatable shaft.

In accordance with another aspect, there is provided support fixture for supporting a plurality of substrates in a coating chamber. The support fixture includes a base having a plurality of recesses formed in an upper surface of the base. A first mounting component has a plurality of slots. The first mounting component is positioned on the upper surface of the base wherein at least some of the plurality of recesses are in registry with corresponding ones of the plurality of slots to define a plurality of cavities. Each of the plurality of cavities is configured to hold at least one of the plurality of substrates to be coated.

In the support fixture the plurality of substrates extends a predetermined distance above an upper surface of the first mounting component.

The support fixture further including a second mounting component. The second mounting component is positioned on the upper surface of the base and has an edge abutting an edge of the first mounting component to close an open end of at least one of the plurality of slots.

In the support fixture at least one of the base, the first mounting component and the second mounting component is made from low-carbon steel.

In the support fixture each of the base, the first mounting component and the second mounting component is made from low-carbon steel.

In support fixture at least one of the base, the first mounting component and the second mounting component is made from 12L14 low-carbon steel.

In the support fixture the base is circular and the plurality of recesses extend radially about an outer periphery of the base.

In the support fixture the first mounting component is a ring and the open ends of the plurality of slots are in registry with an inner opening of the first mounting component.

In the support fixture the support fixture is attached to a rotatable shaft.

DESCRIPTION OF EXAMPLE EMBODIMENTS

Figure 1:
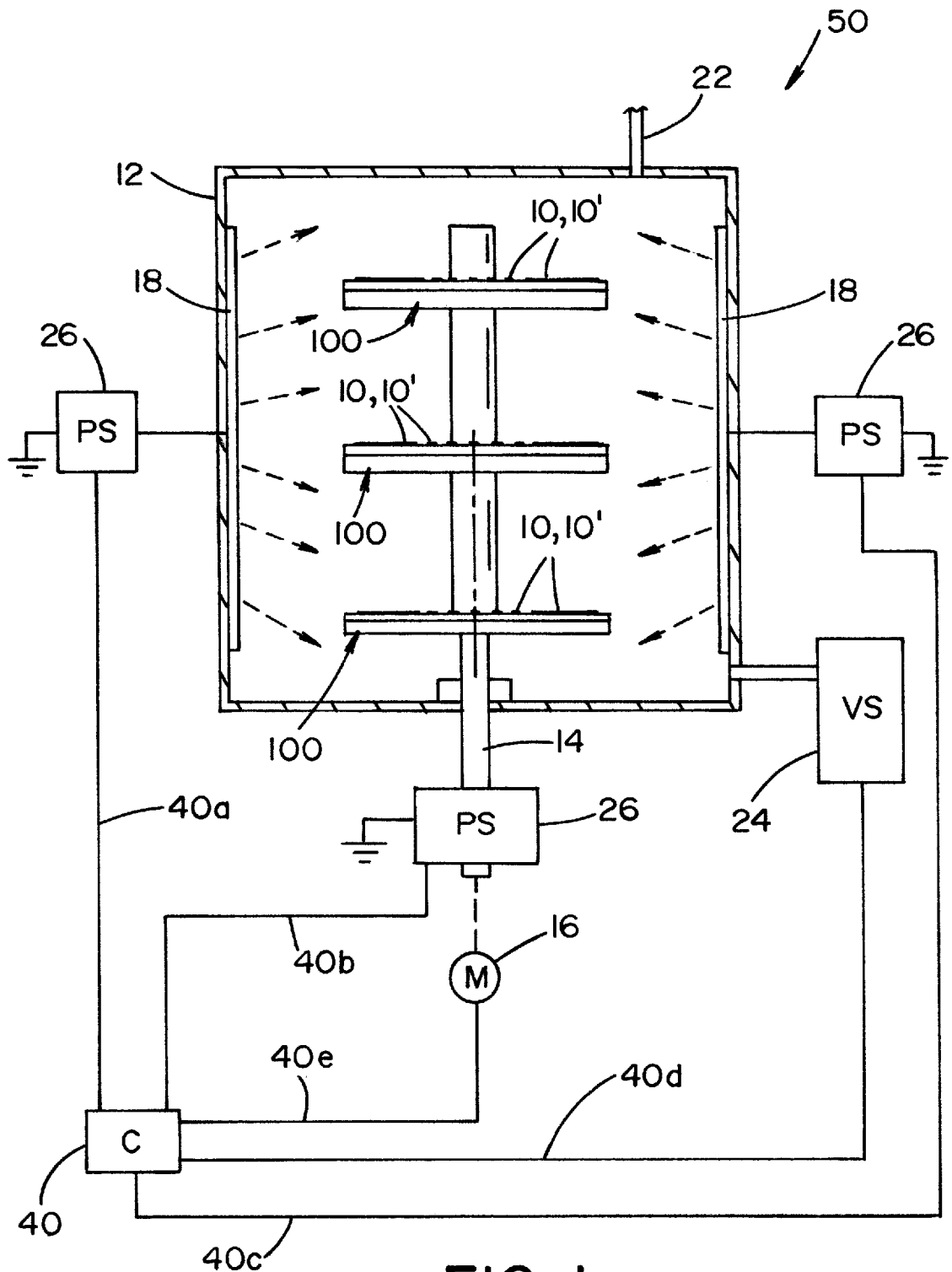
FIG. 1 is a schematic view of coating assembly having a plurality of support fixtures, according to the present invention, disposed in a chamber.
Figure 2:
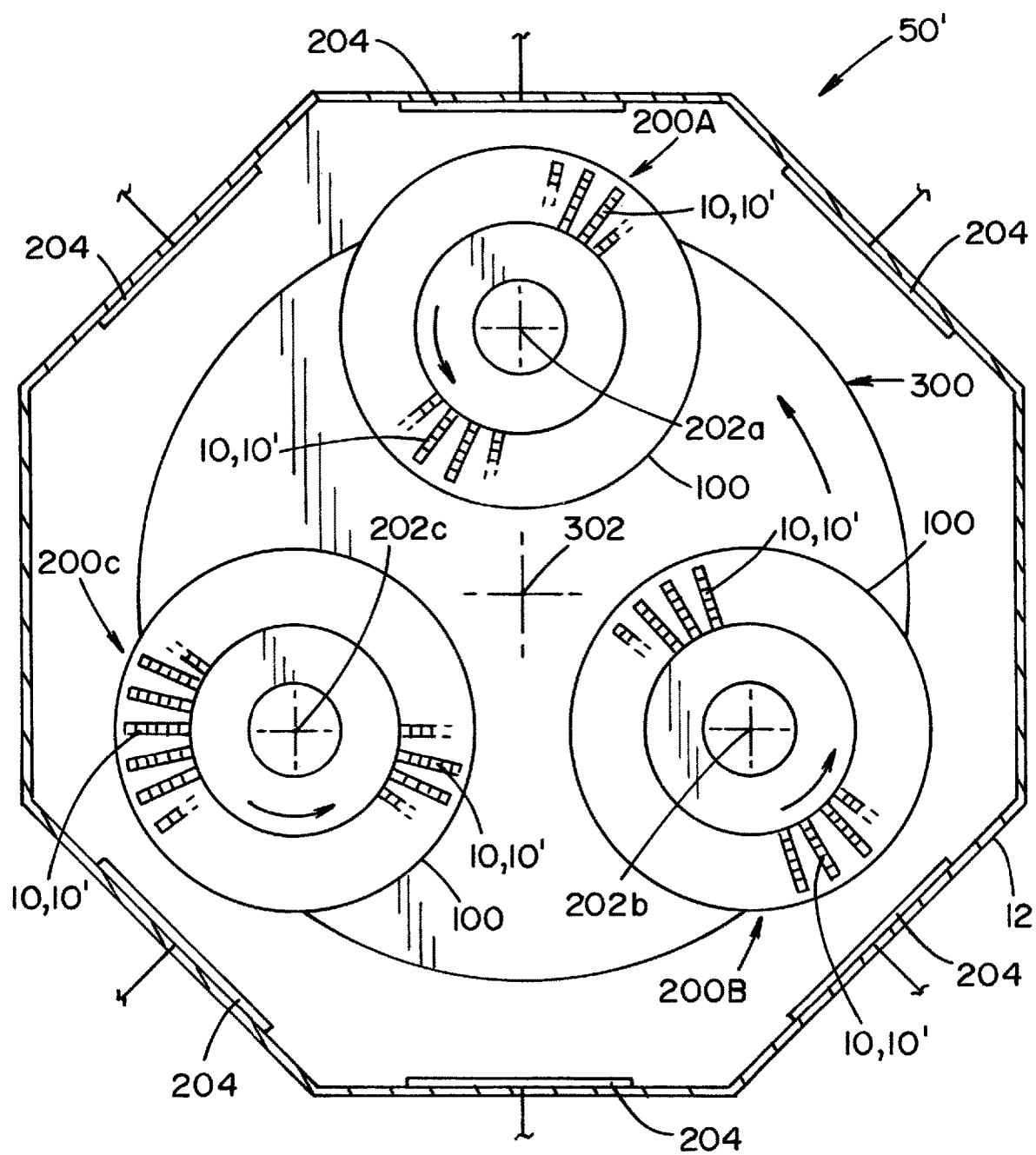
FIG. 2 is a top schematic view of a coating assembly having a plurality of support fixtures disposed on a plurality of rotatable shafts, according to another embodiment of the present invention, disposed in a chamber.

Referring now to the drawings, FIGS. 1 and 2 show coating assemblies 50, 50' for depositing a coating on one or more substrates 10, 10' to be coated. Referring to FIG. 1, the coating assembly 50, in general, includes a chamber 12 for receiving one or more support fixtures 100 (described in detail below) that are attached to a rotating shaft 14. It is contemplated that the shaft 14 may be attached to a motor 16 for rotating the one or more support fixtures 100 and the substrates 10, 10' thereon within the chamber 12. One or more targets 18 may be positioned in the chamber 12 for supplying a material to be coated onto the substrates 10, 10'. It is contemplated that an inlet 22 may extend through a wall of the chamber 12 for supplying a gas to the chamber 12. A vacuum system (VS) 24 may be attached to the chamber 12 for evacuating air from the chamber 12 prior to and/or during the coating process. One or more electrical sources 26 of electrical potential, e.g., a power supply (PS), in particular, an alternating/pulsing power supply, may be connected to the targets 18 and the shaft 14 for generating the required electrical potential for the coating process. It is contemplated that during the coating process the motor 16 may cause the one or more support fixtures 100 to rotate within the chamber 12 such that the material released by the targets 18 may uniformly coat the substrates 10, 10'. It is contemplated that the coating process may be a physical vapor deposition (PVD) process wherein the chamber 12 is a vacuum chamber and the targets 18 and substrates 10, 10' are placed at opposite potentials for transferring a coating material from the targets 18 to the substrates 10, 10'.

A controller 40 is provided for controlling the operation of the motor 16, the vacuum system 24 and the one or more electrical sources 26 of electrical potential. The controller 40 may be programmed to control the operation of the foregoing components to perform a coating process. Various control lines 40a-40e extend from the controller 40 to the components of the coating assembly. Control lines 40a, 40b, 40c connect the controller 40 to sources 26, control line 40d connects the controller 40 to the vacuum system 24 and control line 40e connects the controller 40 to motor 16. It is contemplated that the control lines 40a-40e may be configured to send power and/or signals between the respective component and the controller 40. It is also contemplated that the control lines 40a-40e may represent other commonly known types of wired and/or wireless communication between the controller 40 and the various components of the coating assembly 50, including but not limited to, hard wire, WiFi, ethernet, etc. and combinations thereof.

Referring to FIG. 2, the coating assembly 50' is similar in most aspects to the coating assembly 50. Accordingly, components of the coating assembly 50' that are identical to the components of the coating assembly 50 are referenced using the same reference numbers. A detail discussion is not provided for these components as the detailed discussion above applies to the similar components of the coating assembly 50'. The coating assembly 50' is illustrated with three assemblies 200A, 200B, 200C disposed on a carousel 300, but it is contemplated that any number of assemblies may be placed on the carousel 300. The carousel 300 includes a shaft (not shown) defining a rotational axis 302 of the carousel 300. It is contemplated that the assemblies 200A, 200B, 200C may include any number of support fixtures 100. It is further contemplated that drive shafts (not shown) of the assemblies 200A, 200B, 200C may define rotational axes 202a, 202b, 202c of the assemblies 200A, 200B, 200C, respectively. The drive shafts of the assemblies 200A, 200B, 200C may be attached to the drive shaft of the carousel 300, e.g., via gears, chains, etc. such that rotation of the carousel 300 about the rotational axis 302 imparts rotation to the assemblies 200A, 200B, 200C. It is also contemplated that each assembly 200A, 200B, 200C may include a separate motor (not shown) so that each assembly 200A, 200B, 200C may rotate independently of the carousel 300 and the other respective assemblies 200A, 200B, 200C. It is further contemplated that two or more of the assemblies 200A, 200B, 200C may share a single motor (not shown). In the embodiment shown, the chamber 12 of the coating system 50' includes eight (8) walls. It is contemplated that the chamber 12 may have other shapes, including but not limited to, circular, square, pentagon or a shape with any other number of side walls. Further, the coating system 50' is illustrated in FIG. 2 as including six (6) targets 204. It is contemplated that the coating system 50' may include any other number of targets 204, as desired. In the embodiment shown, the carousel 300 and assemblies 200A, 200B, 200C are illustrated as rotating in one particular direction. It is contemplated that each of the carousel 300 and the assemblies 200A, 200B, 200C may rotate in the opposite direction.

Figure 3:
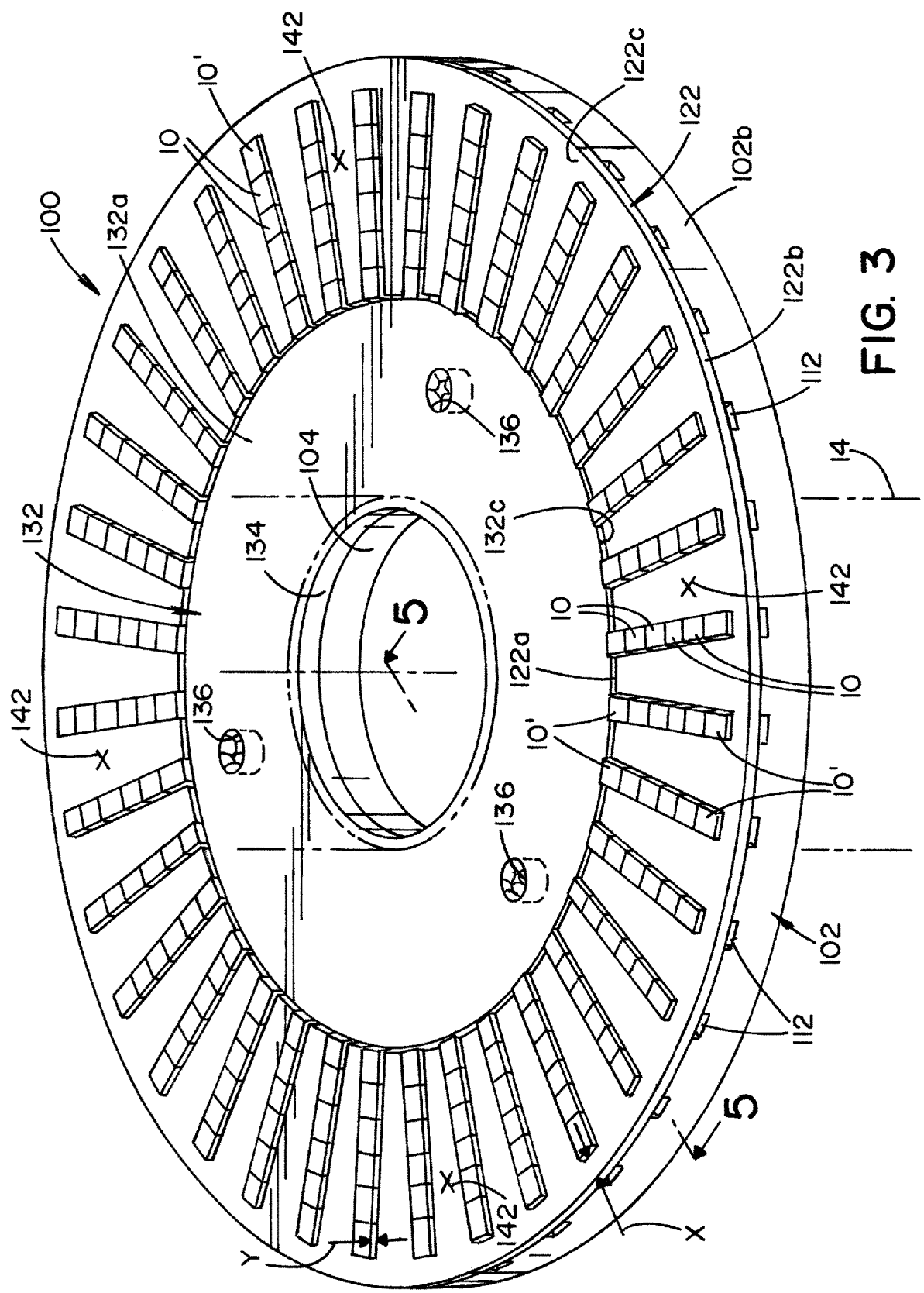
FIG. 3 is an enlarged perspective view a support fixture of FIG. 1 with a plurality of substrates disposed thereon.
Figure 4:
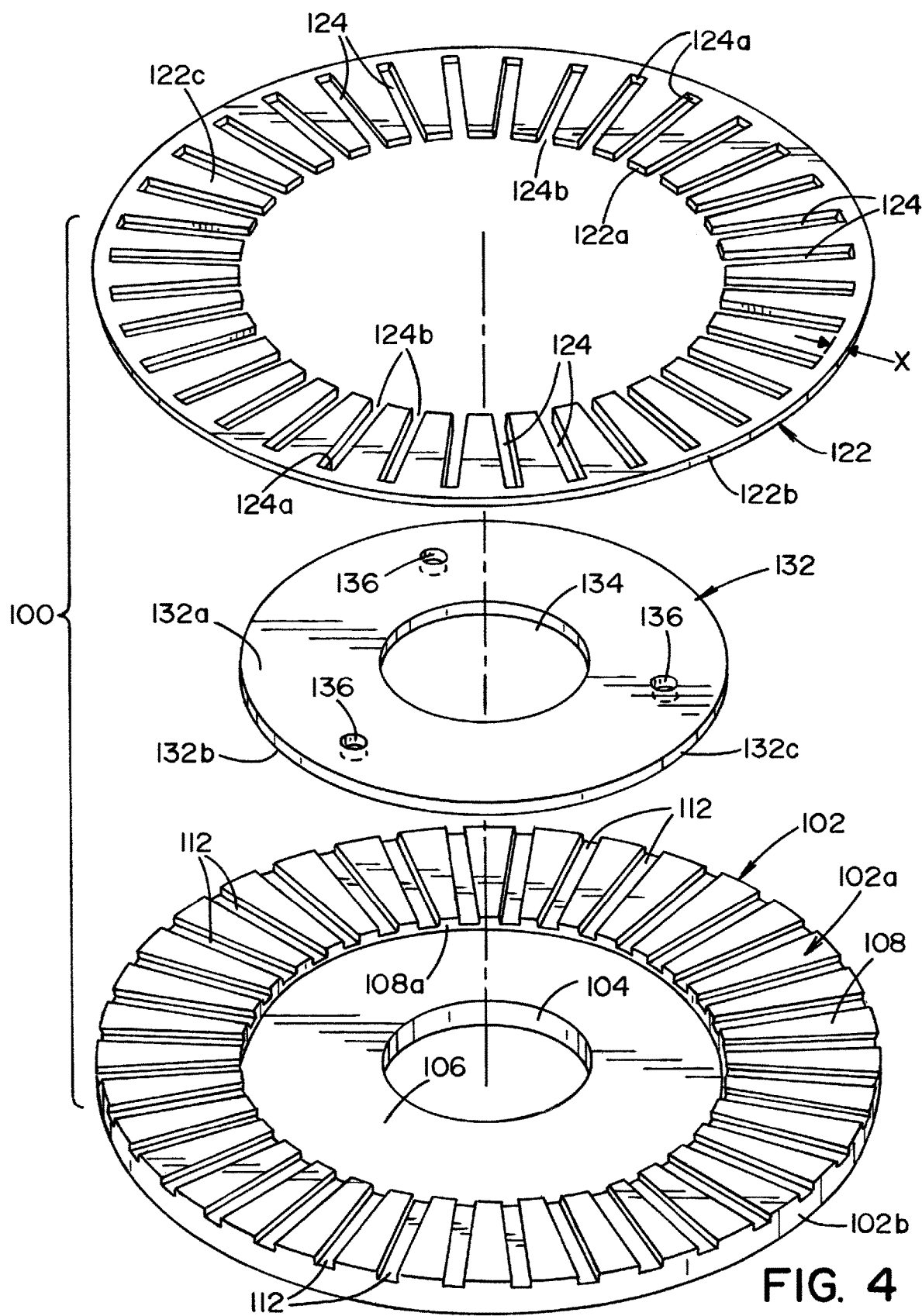
FIG. 4 is an exploded view of the support fixture of FIG. 3.
Figure 5:
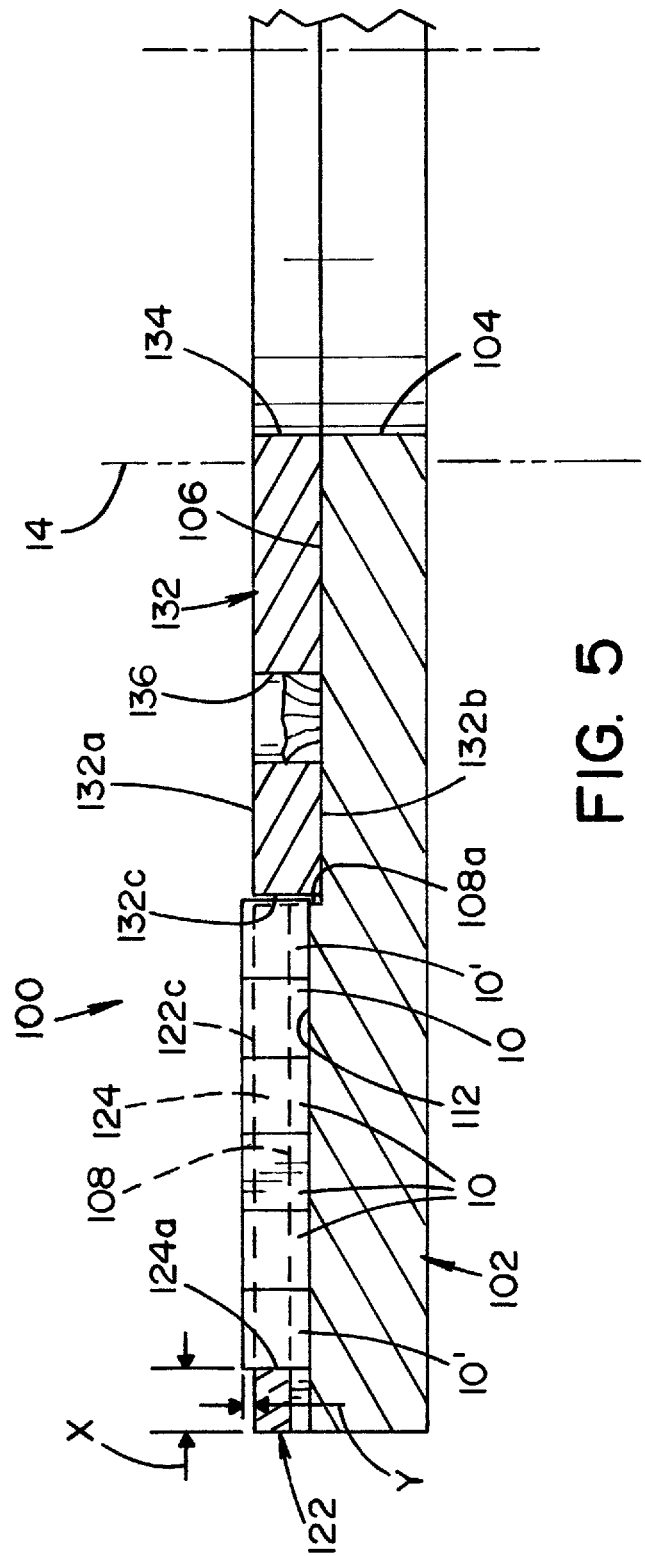
FIG. 5 is an enlarged section view taken through line 4-4 of FIG. 3.

Referring to FIGS. 3-5, the support fixture 100, in general, includes a base 102, a first mounting component 122 and a second mounting component 132. It is contemplated that one or more of the base 102, the first mounting component 122 and the second mounting component 132 may be made from 12L14 low-carbon steel (DIN equivalent 1.0718, ASTM equivalent A29) or from 1.0718 11SMnPb30 Steel. The base 102 includes a centrally located hole 104 that is dimensioned to receive the shaft 14. The hole 104 and/or the shaft 14 may be keyed so that the support fixture 100 rotates with the shaft 14. It is also contemplated that other connection methods, including but not limited to threaded, welding and fasteners may be used for securing the base 102 to the shaft 14.

The base 102 includes an upper surface 102a that is divided into a center portion 106 and a raised portion 108. The center portion 106 extends peripherally about the hole 104. The raised portion 108 extends peripherally about the center portion 106 to an outer peripheral edge 102b of the base 102. The raised portion 108 is vertically higher than the center portion 106. A plurality of recesses 112 is formed in the raised portion 108 and extends radially from an inner edge 108a of the raised portion 108 to the outer peripheral edge 102b of the base 102.

In the embodiment shown, the center portion 106 and the raised portion 108 are planar and flat. It is contemplated that one or both of the center portion 106 and the raised portion 108 may have other contours, including but not limited to sloped, stepped or curved. In the embodiment shown, each of the plurality of recesses 112 is rectangular-in-shape with a planar bottom wall and planar side walls. The plurality of recesses 112 are shown equally spaced apart. It is contemplated that the angular spacing of the plurality of recesses 112 may vary and one or more of the recesses 112 may be skewed relative to a neighboring recess 112. As shown in FIG. 5, the elevation of the bottom surface of the recesses 112 may be slightly higher than the elevation of the center portion 106.

It is contemplated that between about 20 and 50 recesses 112 may be formed in the base 102, preferably between about 30 and 40, more preferably about 36.

In the embodiment shown, the base 102 is circular plate. It is contemplated that the base 102 may have other shapes, including but not limited to square, oval, star or a hub with a plurality of outwardly extending arms. The base 102 may be a formed from a metal plate, e.g., a steel plate.

The first mounting component 122 is contoured to rest on the upper surface 102a of the base 102. The first mounting component 122 includes a plurality of slots 124 that extend from an inner opening 122a of the first mounting component 122 to a location spaced from an outer peripheral edge 122b of the first mounting component 122. Each slot 124 includes a closed end 124a toward the outer peripheral edge 122b and an open end 124b toward the inner opening 122a. The closed end 124a of the slot 124 is positioned a predetermined distance "X" from the outer peripheral edge 122b of the first mounting component 122. The distance "X" may be determined based on the size of the substrates 10, 10' to be coated. In the embodiment shown, the distance "X" is uniform for all the plurality of slots 124. It is contemplated that the distance "X" may vary amongst the plurality of slots 124 so that the number of substrates 10, 10' in each slot 124 may vary.

In the embodiment shown, the plurality of slots 124 is generally rectangular-in-shape and includes flat side walls and a flat end wall. The plurality of slots 124 are shown equally spaced apart in a radial direction. It is contemplated that the spacing of the plurality of slots 124 may vary and one or more of the slots 124 may be skewed relative to a neighboring recess. It is contemplated that the plurality of slots 124 may be formed by laser cutting. It is also contemplated that between about 20 and 50 slots 124 may be formed in the first mounting component 122, preferably between about 30 and 40, more preferably about 36. In the embodiment shown the number of recesses 112 in the base 102 is equal to the number of slots 124 in the first mounting component 122.

In the embodiment shown, the first mounting component 122 is a ring. It is contemplated that the first mounting component 122 may have other shapes, including but not limited to square, oval or star so long as the first mounting component 122 can rest on the base 102. The first mounting component 122 may be a formed from a metal plate, e.g., a steel plate.

The plurality of recesses 112 in the base 102 and the plurality of slots 124 in the first mounting component 122 are dimensioned and positioned to be in registry with each other when the first mounting component 122 is positioned on the base 102. When the first mounting component 122 is placed on the base 102, the base 102 and the first mounting component 122 define a plurality of cavities that are dimensioned to receive the substrates 10, 10' to be coated. The width of the plurality of recesses 112 and the plurality of slots 124 are selected to match the width of the substrates 10, 10'. The combined depth of the plurality of recesses 112 and the thickness of the first mounting component 122 are selected to allow the substrates 10, 10' to extend a predetermined distance "Y" above an upper surface 122c of the first mounting component 122. It is contemplated that the substrates 10, 10' may extend between about 0.100 mm to 0.400 mm above the upper surface 122c, preferably between about 0.200 mm and 0.300 mm, more preferably about 0.291 mm.

The second mounting component 132 is positioned on the center portion 106 of the base 102. The second mounting component 132 includes a central opening 134 that may be larger or equal to the hole 104 of the base 102. The central opening 134 is illustrated in FIGS. 2 and 4 as having a diameter equal to the hole 104 in the base 102. A plurality of holes 136 extend from an upper surface 132a of the second mounting component 132 to a lower surface 132b of the second mounting component 132. In the embodiment shown, the holes 136 are circular holes that are equally spaced-apart. In the embodiment shown, the second mounting component 132 is disc-shaped. It is contemplated that the second mounting component 132 may have other shapes, including but not limited to square, oval or star. The thickness of the second mounting component 132 is selected such that the upper surface 132a is even with the upper surface 122c when the first mounting component 122 and the second mounting component 132 are secured to the base 102. The second mounting component 132 is positioned such that an outer peripheral edge 132c of the second mounting component 132 abuts that inner opening 122a of the first mounting component 122 to close the open ends 124b of the plurality of slots 124.

Referring to FIG. 3, after the first mounting component 122 and the second mounting component 132 are placed on the base 102, the first and second mounting components 122, 132 are secured to the base 102. In the embodiment shown, the plurality of holes 136 are used to weld the second mounting component 132 to the base 102. Further, weld points 142 are positioned around the first mounting component 122 for spot welding the first mounting component 122 to the base 102. In the embodiment shown, there are four weld points 142. It is contemplated that more or fewer weld points 142 may be used based on the size of the support fixture 100.

Referring to FIG. 5, the substrates 10, 10' are shown positioned on the support fixture 100. The substrates 10, 10' are positioned in the plurality of cavities defined by the plurality of recesses 112 and the plurality of slots 124. In particular, the inner substrates 10 are positioned between the end substrates 10'. As described above, the depth of the plurality of recesses 112 and the thicknesses of the first mounting component 122 and the second mounting component are selected such that the substrates 10, 10' extend a predetermined distance "Y" above the upper surfaces 122c, 132a. As such, only a desired portion of a side surface of the substrates 10, 10' is exposed during a coating process (described in detail below).

In addition, the end substrates 10' have a portion of their end surfaces covered by the closed end 124a of the plurality of slots 124 and the outer peripheral edge 132c of the second mounting component 132 except for the portion of the end surface of the substrates 10' that extends above the upper surfaces 122c, 132a. Because the inner substrates 10 are between the end substrates 10', the end surfaces of the inner substrates 10 are completely covered by an adjacent inner substrate 10 or one of the end substrates 10'.

The coating assembly 50 will now be described with respect to the operation of the same. Prior to the coating process, the support fixture 100 is placed within the chamber 12. Prior to placing the support fixture 100, the substrates 10, 10' may be placed in the plurality of cavities defined by the plurality of recesses 112 and the plurality of slots 124 in the base 102 and the first mounting component 122, respectively.

During operation of the coating assembly 50, the controller 40 causes the motor 16 to turn such that the support fixture 100 rotates within the chamber 12. The rotation of the support fixture 100 causes the substrates 10, 10' to pass by the targets 18. Once the support fixtures 100 have reached a predetermined rotational speed, the controller 40 energizes the vacuum system 24 to evacuate the chamber 12 to a desired pressure, based on the desired coating process. The electrical sources 26 may be energized, as desired to cause coating material to be ejected from the targets 18. As described above, the spacing and dimensions of the cavities defined by the plurality of recess 112 and the plurality of slots 124 may be selected to allow for optimal coating of the substrates 10, 10'.

The support fixtures 100 are configured such that the substrates 10, 10' remain secured with a top surface and a predetermined portion of the side surfaces of the substrate 10, 10' are exposed to the targets 18 as the support fixture 100 rotates within the chamber 12. As such, the present invention may allow for a more efficient coating process where more substrates 10, 10' may be coated in a single batch and specific parts of the substrates 10, 10' are coated.

As described in detail above, the support fixture 100 includes three separate parts, i.e., the base 102, the first mounting component 122 and the second mounting component 132. The plurality of substrates 10, 10' rest on the base 102 while the first mounting component 122 and the second mounting component 132 mask the surfaces of the plurality of substrates 10, 10' that are not to be coated by the coating material. The support fixture 100 addresses the problem of incomplete or inaccurate coating of substrates 10, 10', e.g. saw blade teeth, by providing an assembly that grips the sides of the substrates 10, 10' and masks a portion of the side surface of the substrate 10, 10' to leave a predetermined portion of the side surfaces exposed for coating during a coating process. An operator is able to accurately and repeatedly coat a plurality of substrates 10, 10' all having the same amount of the side surface coated.

The invention has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims and their equivalents.

What is claimed is:

1. A coating assembly for coating a plurality of substrates, the coating assembly comprising:
    a chamber;
    at least one target disposed in the chamber and comprising a coating material;
    at least one power supply connected to the target; and
    at least one support fixture disposed in the chamber, the at least one support fixture comprising:
        a base having a plurality of recesses formed in an upper surface of the base wherein at least one of the plurality of recesses opens to a surrounding environment at an outer peripheral edge of the base; and
        a first mounting component having a plurality of slots, the first mounting component positioned on the upper surface of the base wherein at least some of the plurality of recesses are in registry with corresponding ones of the plurality of slots to define a plurality of cavities, each of the plurality of cavities configured to hold at least one of the plurality of substrates to be coated.

2. The coating assembly according to claim 1, wherein the base and the first mounting component are configured such that the plurality of substrates extends a predetermined distance above an upper surface of the first mounting component.

3. The coating assembly according to claim 1, further comprising a second mounting component, the second mounting component positioned on the upper surface of the base and having an outer peripheral edge abutting an inner peripheral edge of the first mounting component to close an open end of at least one of the plurality of slots.

4. The coating assembly according to claim 3, wherein at least one of the base, the first mounting component and the second mounting component is made from low-carbon steel.

5. The coating assembly according to claim 4, wherein each of the base, the first mounting component and the second mounting component is made from low-carbon steel.

6. The coating assembly according to claim 3, wherein at least one of the base, the first mounting component and the second mounting component is made from 12L14 low-carbon steel.

7. The coating assembly according to claim 6, wherein each of the base, the first mounting component and the second mounting component is made from 12L14 low-carbon steel.

8. The coating assembly according to claim 1, wherein the base is circular and the plurality of recesses extend radially about an outer periphery of the base.

9. The coating assembly according to claim 8, wherein the first mounting component is a ring and open ends of the plurality of slots are in registry with an inner opening of the first mounting component.

10. The coating assembly according to claim 1, wherein the at least one support fixture is attached to a rotatable shaft or a plurality of rotatable shafts is disposed in the chamber and each of the plurality of rotatable shafts includes at least one support fixture.

11. The coating assembly according to claim 1, further comprising:
    a shaft attached to a central opening of the at least one support fixture and a motor attached to the shaft for rotating the shaft and the at least one support fixture within the chamber about a longitudinal axis of the shaft, or
    a plurality of rotatable shafts disposed in the chamber and each of the plurality of rotatable shafts including at least one support fixture that is rotatable about a longitudinal axis of a respective rotatable shaft.

* * * * *